US012802935B2

(12) United States Patent
Pan

(10) Patent No.: US 12,802,935 B2
(45) Date of Patent: Nov. 17, 2026

(54) SYSTEM AND METHOD FOR DELIVERING PULSED RF POWER FROM MULTIPLE GENERATORS TO A SINGLE LOAD

(71) Applicant: Yang Pan, Singapore (SG)

(72) Inventor: Yang Pan, Singapore (SG)

(73) Assignee: Inspiring Atoms Pte Ltd, Singapore (SG)

(*) Notice: Subject to any disclaimer, the term of this patent is extended or adjusted under 35 U.S.C. 154(b) by 139 days.

(21) Appl. No.: 19/004,307

(22) Filed: Dec. 28, 2024

(65) Prior Publication Data

US 2026/0188613 A1 Jul. 2, 2026

(51) Int. Cl.
*H01J 37/32* (2006.01)

(52) U.S. Cl.
CPC .. *H01J 37/32146* (2013.01); *H01J 37/32128* (2013.01)

(58) Field of Classification Search
CPC ...................... H01J 37/32146; H01J 37/32128
See application file for complete search history.

(56) References Cited

U.S. PATENT DOCUMENTS 6,509,542 B1 1/2003 Benjamin et al.
6,920,312 B1 7/2005 Benjamin
8,692,467 B2 4/2014 Benjamin et al.
8,710,926 B2 4/2014 Nagarkatti et al.
8,736,175 B2 5/2014 Long et al.
8,736,377 B2 5/2014 Rughoonundon et al.
8,741,095 B2 6/2014 Koshimizu
8,962,488 B2 2/2015 Liao et al.
9,059,678 B2 6/2015 Long et al.
9,171,700 B2 10/2015 Gilmore
9,305,750 B2 4/2016 Long et al.
9,336,996 B2 5/2016 Long et al.
9,390,893 B2 7/2016 Valcore, Jr. et al.
9,401,264 B2 7/2016 Marakhtanov et al.
9,515,633 B1 12/2016 Long et al.
9,536,749 B2 1/2017 Marakhtanov et al.
9,595,423 B2 3/2017 Leray et al.
9,627,186 B2 4/2017 Valcore, Jr. et al.
9,652,567 B2 5/2017 Valcore, Jr. et al.
9,659,757 B2 5/2017 Kuthi et al.
9,721,758 B2 8/2017 Coumou et al.
9,872,373 B1 1/2018 Shimizu et al.
9,984,859 B2 5/2018 Marakhtanov et al.
10,032,605 B2 7/2018 Valcore, Jr. et al.
(Continued)

FOREIGN PATENT DOCUMENTS

EP 2 642 661 B1 9/2021
TW 1831807 B 2/2024

*Primary Examiner* — Seokjin Kim

(57) ABSTRACT

Disclosed herein is a system and method for delivering pulsed RF power from multiple generators to a load in semiconductor manufacturing processes. The system employs a Multi-Pole Single-Throw (MPST) switch controlled by a controller that coordinates pulse generation timing across the generators. Latencies between pulse generation and switching for each generator are calibrated to a common clock to ensure precise synchronization. Delay elements can be introduced to place precisely each pulse from different generators into a mater pulse train. Additionally, a tailored waveform generator may be incorporated, particularly in providing bias voltage for an electrostatic chuck.

20 Claims, 5 Drawing Sheets

(56) References Cited

U.S. PATENT DOCUMENTS 10,056,231 B2 8/2018 Long et al.
10,102,321 B2 10/2018 Povolny et al.
10,141,163 B2 11/2018 Lill et al.
10,157,729 B2 12/2018 Valcore, Jr.
10,256,077 B2 4/2019 Valcore, Jr. et al.
10,276,348 B2 4/2019 Marakhtanov et al.
10,325,759 B2 6/2019 Valcore, Jr. et al.
10,325,760 B2 6/2019 Valcore, Jr. et al.
10,381,201 B2 8/2019 Lyndaker et al.
10,403,482 B2 9/2019 Howald et al.
10,431,434 B2 10/2019 Long et al.
10,573,494 B2 2/2020 Shoeb et al.
10,580,618 B2 3/2020 Shoeb et al.
10,679,825 B2 6/2020 Wu et al.
10,734,195 B2 8/2020 Long et al.
10,755,895 B2 8/2020 Marakhtanov et al.
10,847,345 B2 11/2020 Long et al.
10,984,985 B2 4/2021 Mavretic
11,038,483 B2 6/2021 Leeser et al.
11,114,280 B2 9/2021 Bhutta et al.
11,158,488 B2 10/2021 Radomski et al.
11,224,116 B2 1/2022 Long et al.
11,437,219 B2 9/2022 Long et al.
11,716,059 B2 8/2023 Raymond et al.
11,776,789 B2 10/2023 Dorf et al.
11,798,784 B2 10/2023 Valcore, Jr. et al.
11,915,912 B2 * 2/2024 Shoeb ............... H01J 37/32146
2015/0235808 A1 8/2015 Kamp et al.
2016/0268100 A1 * 9/2016 Valcore, Jr. ....... H01J 37/32183
2017/0084429 A1 3/2017 Marakhtanov et al.
2017/0372912 A1 12/2017 Long et al.
2018/0358205 A1 12/2018 Long et al.
2019/0109576 A1 4/2019 Long et al.
2019/0149119 A1 * 5/2019 Kapoor ................. C23C 16/458
333/17.1
2020/0168438 A1 5/2020 Shoeb et al.
2020/0243304 A1 * 7/2020 Valcore, Jr. .............. H05H 1/46
2021/0183619 A1 6/2021 Patrick et al.
2021/0210314 A1 7/2021 Wang et al.
2022/0182024 A1 * 6/2022 Nguyen ................ H03F 1/0227
2022/0199365 A1 6/2022 Long et al.
2022/0216038 A1 7/2022 Wu et al.
2023/0113683 A1 4/2023 Long
2023/0124201 A1 * 4/2023 Shoeb ............... H01J 37/32146
438/798
2023/0126058 A1 4/2023 Long et al.
2023/0238216 A1 * 7/2023 Singh ................ H01J 37/32082
307/52
2023/0245873 A1 8/2023 Long et al.
2023/0290611 A1 9/2023 Benjamin et al.
2023/0360883 A1 11/2023 Long et al.
2024/0128892 A1 * 4/2024 Kim ...................... H01J 37/321
2024/0258071 A1 * 8/2024 Luu ................... H01J 37/32146
2025/0140541 A1 * 5/2025 Guo .................... H01J 37/3299
2025/0158602 A1 * 5/2025 Shterzer .................... H03K 3/57
2025/0210361 A1 * 6/2025 Sherpa .................. H10P 50/242
2025/0323020 A1 * 10/2025 Seo ...................... H01J 37/3211
2026/0045463 A1 * 2/2026 Pan ................... H01J 37/32935

* cited by examiner

SYSTEM AND METHOD FOR DELIVERING PULSED RF POWER FROM MULTIPLE GENERATORS TO A SINGLE LOAD

FIELD

The present invention relates to systems and methods for delivering radio frequency (RF) power from multiple power generators to a single load, particularly for use in semiconductor manufacturing process systems.

BACKGROUND

In semiconductor manufacturing, processes such as plasma etching and deposition require precise and flexible RF power delivery to achieve optimal plasma conditions and effective substrate processing. Conventional systems typically use multiple RF generators connected to a load through complex matching and combining networks. These configurations often result in inefficiencies, reduced precision, and limited adaptability to the increasingly complex demands of advanced semiconductor processes.

Modern semiconductor process systems frequently use pulsed RF power, creating opportunities to combine RF power from multiple generators in the time domain. Achieving this requires a high-speed switch capable of managing the rapid transitions between generators. Multi-Pole Single-Throw (MPST) switches, implemented with advanced technologies such as GaN high-electron-mobility transistors (GaN HEMTs), provide a novel approach to time-domain RF power combination. GaN HEMTs offer rapid and efficient switching, enabling the delivery of high-power RF signals with minimal loss.

Despite these advantages, challenges remain in managing precise timing and latency when coordinating pulse trains from multiple generators. Unaddressed latencies can cause interference among pulses, energy loss, and suboptimal process performance, particularly in applications requiring tight control of plasma characteristics.

The present invention addresses these challenges by introducing an innovative RF power delivery system that incorporates advanced latency management and timing control. This system ensures synchronized and efficient power delivery from multiple RF generators to a single load, optimizing performance for semiconductor manufacturing processes.

SUMMARY

The present invention provides an RF system for delivering RF power from multiple generators to a single load with enhanced precision, flexibility, and scalability. The system employs a MPST switch to combine RF power from multiple generators into a master pulse train, which is delivered to the load. The MPST switch, implemented using GaN HEMTs, facilitates high-speed switching with minimal losses, enabling efficient power delivery.

The RF system comprises multiple RF power generators, each capable of generating pulse trains with configurable parameters, including power level, duty cycle, and pulse duration. A controller coordinates the timing and combination of pulses from each generator to produce a master pulse train with non-overlapping pulses, optimizing the performance of the load.

Latency and timing management are central to the invention. Each RF generator exhibits inherent latency between pulse generation and switching by the MPST switch. To address this, the controller includes a time control module with delay elements and a latency module that compensates for generator-specific latencies. These latencies are determined through predictive modeling, simulations, or measurement procedures executed by the controller. In some implementations, the delay elements are programmable, offering additional flexibility.

The time control module ensures precise pulse placement within the master pulse train, preventing overlap and synchronizing delivery to the load. A shared common clock among the generators, controller, and MPST switch enhances timing precision. Alternatively, independent clocks may be calibrated to a reference clock managed by the controller, ensuring system-wide synchronization.

In one implementation, the load is an electrostatic chuck (ESC) within a plasma chamber. The master pulse train optimizes plasma density, ion directionality, and ion energy distribution by delivering pulses with mixed frequencies and tailored waveforms. This approach enhances process performance by providing tighter control over critical plasma parameters.

The RF system offers a scalable and adaptable solution for semiconductor manufacturing, with precise timing control and latency management enabling consistent and efficient power delivery. Its flexibility supports complex processes, such as plasma etching and deposition, while addressing the challenges of power delivery synchronization.

BRIEF DESCRIPTION OF DRAWINGS

For enhanced clarity, the following description refers to the accompanying drawings.

DETAILED DESCRIPTION

Figure 1A:
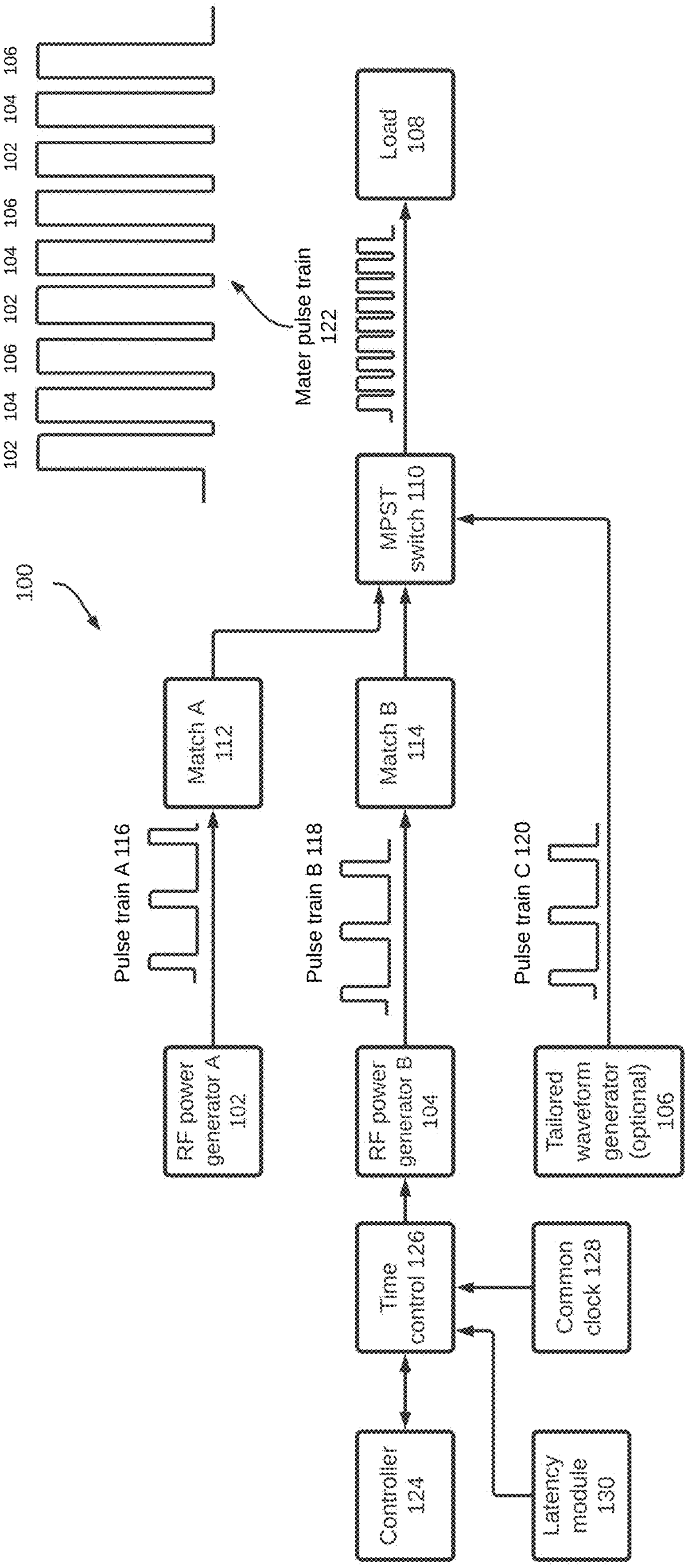
FIG. 1A: Depicts an exemplary RF system delivering RF power from three generators to a single load using independent matches in a first embodiment.

To ensure a comprehensive understanding of the present invention, this section explores detailed embodiments and technical aspects. Specific examples are provided for clarity; however, modifications and variations that align with the claims are considered within the scope of the invention. Conventional methods and components are discussed to emphasize the unique and inventive features of the system.

Terms and Definitions

- RF Power Generator: A device that generates RF power at predetermined frequencies and power levels, often modulated by a square waveform with a duty cycle. These generators are used in plasma-based processes for semiconductor manufacturing.
- Multi-Pole Single-Throw (MPST) Switch: A switch that routes RF power from multiple inputs to a single output with high-speed switching capabilities, often implemented using GaN HEMT technology.

GaN High-Electron-Mobility Transistor (GaN HEMT): High-performance transistors made from Gallium Nitride, enabling fast switching (nanoseconds to microseconds), low conduction losses, and handling high RF power levels up to tens of kilowatts.

Pulse Train: A series of pulses characterized by defined frequencies, duty cycles, and power levels, modulating RF signals for precise delivery to a load.

Master Pulse Train: A composite pulse train formed by combining pulses from multiple RF generators through the MPST switch, delivering synchronized RF power to a load.

Tailored Waveform: A customized voltage waveform designed for plasma-based processing to control surface charge, and refine ion energy distribution.

Controller: A central system component that oversees operations of the RF system, including pulse generation, timing synchronization, latency compensation, and coordination of the MPST switch.

Matching Network (Match): A circuit or system that ensures impedance matching between the RF generator and the load to optimize power transfer and minimize signal reflections.

Duty Cycle: The proportion of time during which an RF signal or pulse is active within a single period, expressed as a percentage, crucial for controlling power delivery.

Latency Module: A subsystem within the controller that compensates for timing discrepancies caused by latencies in RF power generation and switching, ensuring precise pulse synchronization.

Electrostatic Chuck (ESC): A powered electrode in a plasma chamber that holds a substrate in place and delivers RF power to influence plasma parameters during processing.

Plasma Chamber: A chamber where plasma is generated and sustained, used for semiconductor processes such as etching, deposition, or surface treatments.

Capacitively Coupled Plasma (CCP) Reactor: A plasma reactor design utilizing a powered electrode (e.g., ESC) and a grounded electrode (e.g., showerhead) to generate plasma with applied RF power.

Impedance Matching: The process of aligning the load impedance with the source impedance to optimize power transfer and minimize energy loss.

Plasma Parameters: Characteristics of plasma, including density, ion directionality, and ion energy distribution, controllable using RF power and tailored waveforms.

Time Control Module: A component within the controller that synchronizes the timing of pulse generation and switching operations across multiple RF generators and the MPST switch.

Delay Element: A device or circuit that introduces time offsets to pulse trains, compensating for latency differences among RF generators to achieve precise synchronization.

FIG. 1A illustrates a first embodiment of an RF system 100 designed to deliver RF power from multiple generators (102, 104, 106) to a single load 108. While three generators are depicted for illustrative purposes, the system can support a greater or lesser number of generators, depending on the specific application.

In one implementation, the generators may include RF power generators capable of outputting RF power at a single frequency, such as 400 kHz, 1 MHz, or 13.56 MHz, with an output power range of 50 to 2000 watts. In another implementation, the system may include a tailored waveform generator, which produces customized waveforms designed to tighten ion energy distribution. Tailored waveforms may include features such as a constant positive voltage phase to neutralize positive ions trapped on the substrate's surface during a preceding plasma step, thereby mitigating surface charging effects and ensuring uniform electrical potential. This phase is followed by a negative voltage ramping phase, modulated to maintain a constant surface electrical potential by balancing positive ion accumulation. The ramping profile and amplitude of the negative voltage are optimized to conserve charge and enhance process stability, making tailored waveforms particularly effective for etching high-aspect-ratio structures or deposition operations requiring precise surface condition control.

FIG. 1A demonstrates a configuration featuring two RF power generators (102, 104) and one tailored waveform generator (106). The generators are connected to the load 108 via a MPST switch 110, which combines the RF power from the generators and delivers the aggregated power to the load 108.

Figure 1B:
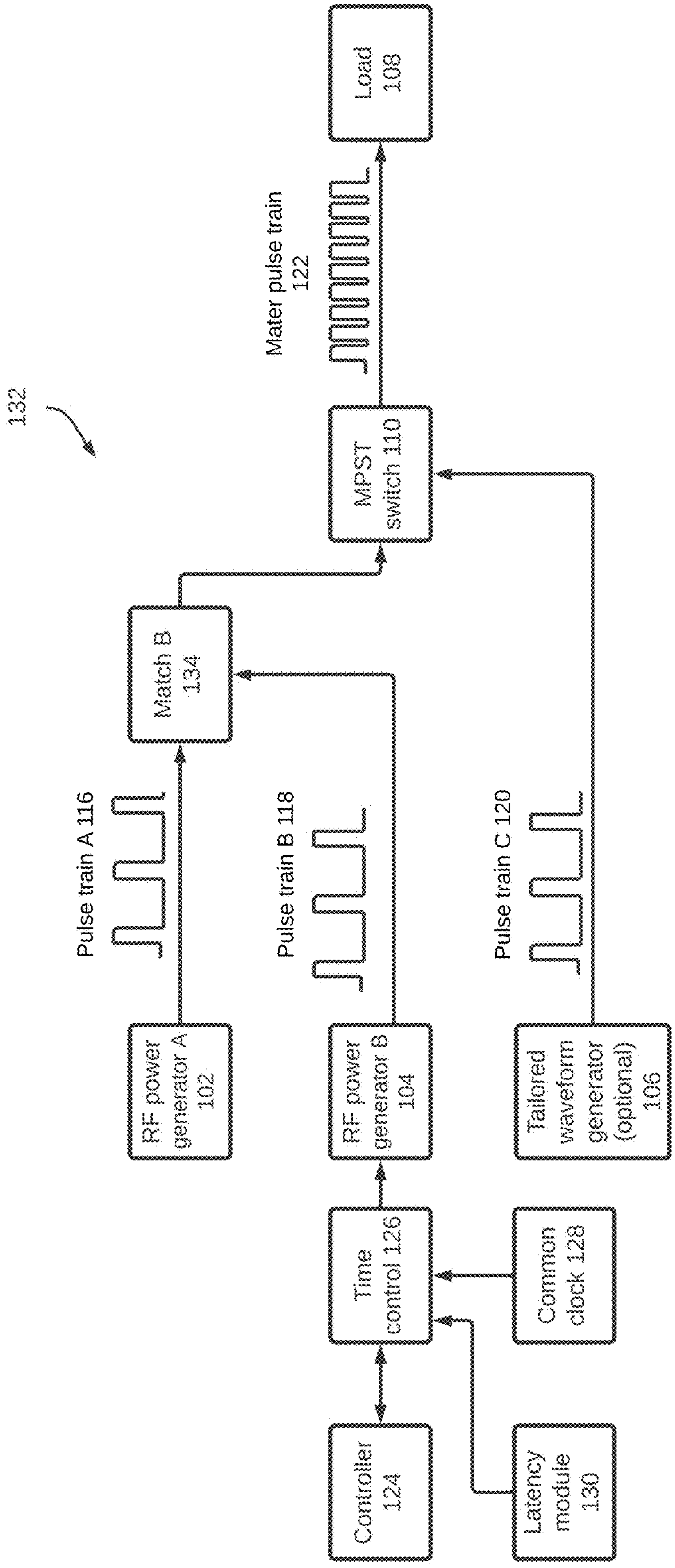
FIG. 1B: Depicts an exemplary RF system delivering RF power from three generators to a single load using a shared match in a second embodiment.

In one configuration, each RF power generator is coupled to the load 108 through a distinct matching network, such as match A 112 for generator 102 and match B 114 for generator 104. The tailored waveform generator 106 may not require a matching network due to its operation at a lower frequency below the RF range. Alternatively, as depicted in FIG. 1B, a single shared matching network (match) 134 may be used to connect the generators to the load. The shared match 134 may incorporate electrically tunable components or adjustable operating frequencies to accommodate varying load requirements.

The RF power from each generator (102, 104, 106) is delivered in the form of pulse trains (116, 118, and 120, respectively). These pulse trains are generated by applying a square wave modulation to the RF or tailored waveform signals, with a duty cycle ranging from 5% to 95% and a square wave frequency ranging from 100 Hz to 100 kHz. This configuration provides significant flexibility in power delivery.

The MPST switch 110 is a critical component of the RF system 100. In one implementation, the switch utilizes GaN HEMTs for rapid switching. GaN HEMTs are well-suited for this application due to their high electron mobility, wide bandgap, and excellent thermal conductivity. These attributes enable GaN HEMTs to operate efficiently at high switching frequencies (up to several hundred megahertz) while handling significant power levels, such as tens of kilowatts. This makes them ideal for RF systems used in semiconductor manufacturing, where rapid and precise power control is essential.

The MPST switch 110, employing multiple GaN HEMTs, connects the outputs of the generators (102, 104, 106) to the load 108. Its fast switching capability, ranging from nanoseconds to microseconds, ensures precise timing and power distribution, even under demanding plasma processing conditions. Additionally, GaN HEMTs exhibit low conduction losses and high breakdown voltage, providing reliable performance in high-power RF systems.

In some implementations, the MPST switch 110 may use alternative technologies, such as Si MOSFETs, SiC MOSFETs or mechanical relays, depending on the application's requirements. The MPST switch 110 may also comprise multiple independent switches, each capable of connecting to and disconnecting from a generator with high speed. Using independent switches minimizes impedance effects from unconnected paths, improving RF power delivery precision.

A controller 124 coordinates the overall operation of the RF system 100. It manages the timing of each pulse in the pulse trains (116, 118, 120) through a time control module 126. The time control module 126, which may be implemented in software, firmware, hardware, or a combination thereof, includes a common clock 128 to synchronize the operations of all the generators (102, 104, 106) and the MPST switch 110. In some configurations, the match 134 may also utilize the common clock 128. Alternatively, the controller 124, each generator, the MPST switch 110, and the match 134 may each include independent clocks calibrated to a reference clock managed by the controller 124.

Due to inherent latencies associated with each generator, the time control module 126 incorporates a latency module 130. This module determines the latency for each generator, enabling precise synchronization of pulse generation and switching operations. The latency module 130 may be implemented using software, firmware, hardware, or a combination thereof. Latency can be determined through predictive modeling or via a measurement procedure executed by the controller 124.

It should be noted that the use of modules 126, 128, and 130 is optional and should not limit the inventive concept's scope.

Figure 1C:
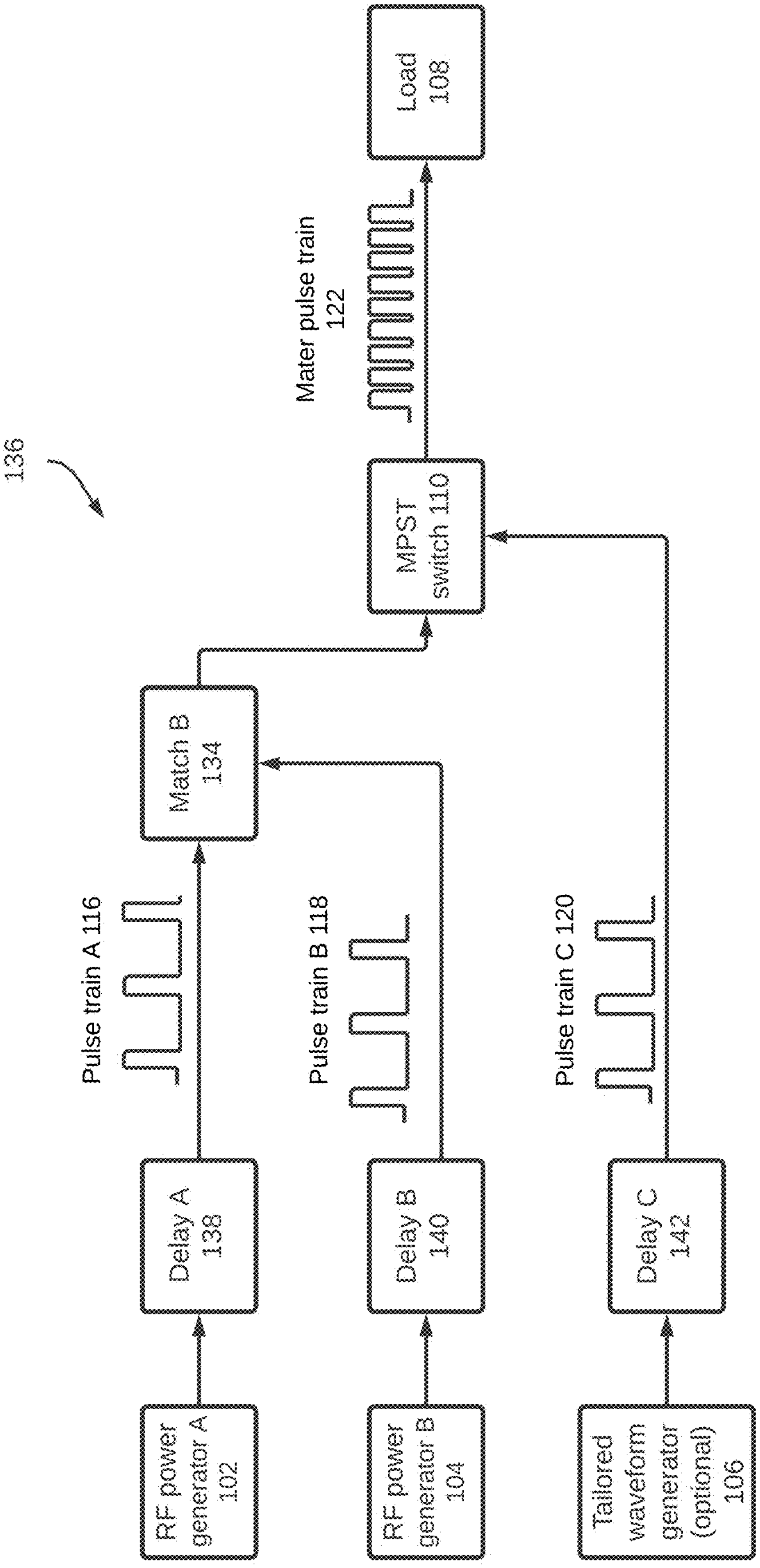
FIG. 1C: Illustrates an exemplary RF system using delay elements to synchronize signals from different generators.

FIG. 1C depicts an implementation where delay elements (138, 140, 142) are introduced to manage differences in latencies among the RF generators. In high-power RF circuits delivering pulsed RF power, delays are implemented using techniques and components designed to preserve the integrity of high-power RF signals.

One common method involves using coaxial delay lines, which are precisely engineered lengths of coaxial cable that introduce fixed time delays. These are well-suited for high-power RF systems due to their ability to handle high frequencies and power levels typical of such systems.

Another approach is the use of tunable phase shifters or electronically controlled delay components such as varactor diodes. These components allow for dynamic adjustment of delay durations, making them effective for systems requiring variable pulse timing.

For more complex configurations, hybrid solutions combining digital and analog controls can be used. For example, digital controllers implemented with field-programmable gate arrays (FPGAs) can generate precise timing signals to control high-speed RF switches or phase shifters, introducing programmable delays. These methods are particularly effective in RF systems with pulsed power delivery, where synchronization of pulse timing is critical for combining signals or optimizing plasma processes.

These delay implementation methods ensure minimal power loss, precise control, and compatibility with the high-frequency nature of the signals, offering significant flexibility and performance benefits. Although FIG. 1C demonstrates this approach in the context of the second embodiment, the methodology is adaptable to both embodiments.

In this configuration, the MPST switch 110 receives pulses (116, 118, 120) generated by the respective RF generators (102, 104, 106). The pulses are configured to avoid overlap in the time domain, allowing the MPST switch 110 to combine them into a master pulse train 122, as shown in the top-right corner of FIG. 1. The master pulse train 122 is a composite signal comprising pulses from all generators. Each pulse may differ in frequency, power level, and duration, providing significant design flexibility.

The pulses can be arranged using various schemes tailored to specific process requirements. For example, pulses from different generators do not need to occur with the same frequency or power level, and the time lapse between successive pulses may vary. This flexibility allows the system to optimize plasma processing conditions, presenting a clear advantage of the inventive concept. Such adaptability opens opportunities for substantial performance improvements in plasma-based processes conducted in a plasma chamber.

Figure 1D:
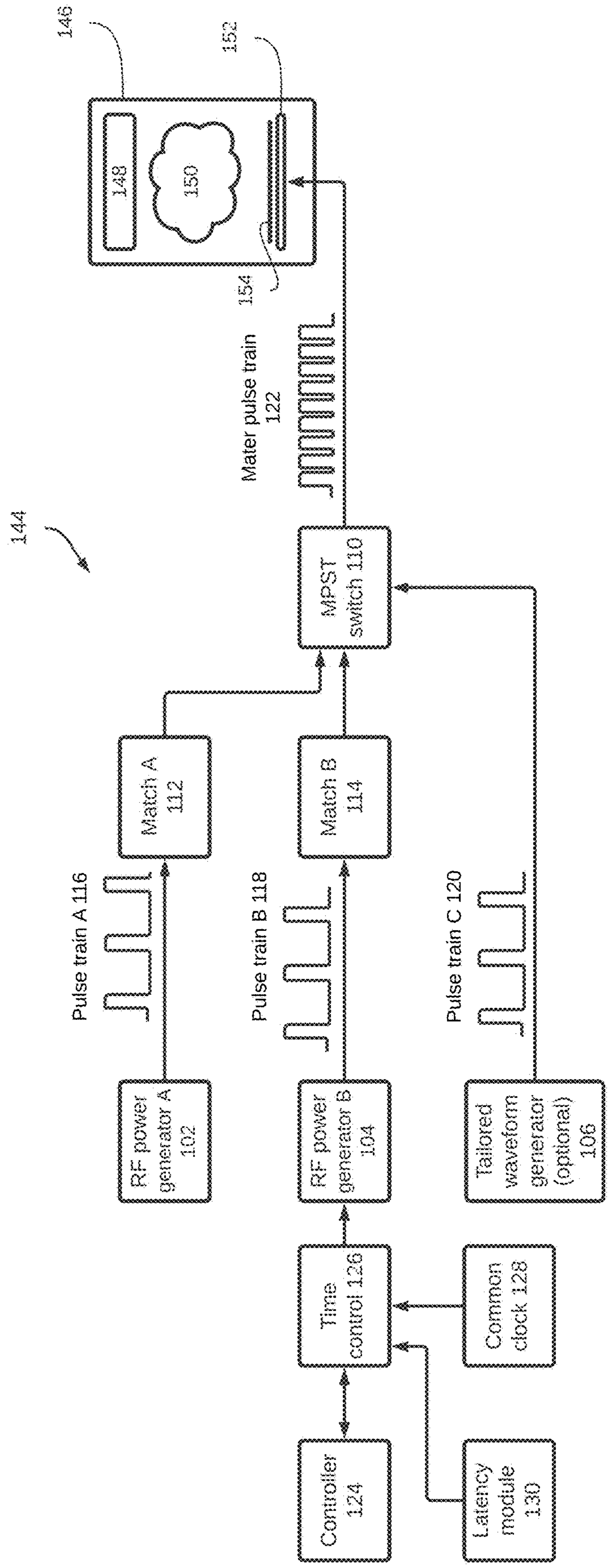
FIG. 1D: Depicts an exemplary RF system delivering RF power from three generators to an ESC to establish a bias voltage for processing a substrate in a plasma chamber.

FIG. 1D illustrates an implementation where the load 108 is an electrostatic chuck (ESC) within a plasma chamber 146. In one configuration, the plasma chamber 146 features the ESC 152 as a powered electrode and a showerhead 148 as a grounded electrode, forming a capacitively coupled plasma (CCP) reactor. Plasma 150 is ignited by applying RF power to the ESC 152, enabling the processing of a substrate 154 held by the ESC.

In certain applications, the ESC 152 receives mixed-frequency RF power. The higher-frequency component increases plasma density, while the lower-frequency component enhances ion energy and directionality. In other configurations, tailored waveforms are integrated with RF power to achieve a tighter ion energy distribution. The master pulse train 122, with distinct RF frequencies for its pulses, effectively optimizes plasma density, ion energy, and directionality. Furthermore, integrating tailored waveforms into the master pulse train 122 enhances ion energy distribution, improving overall process outcomes.

Figure 2:
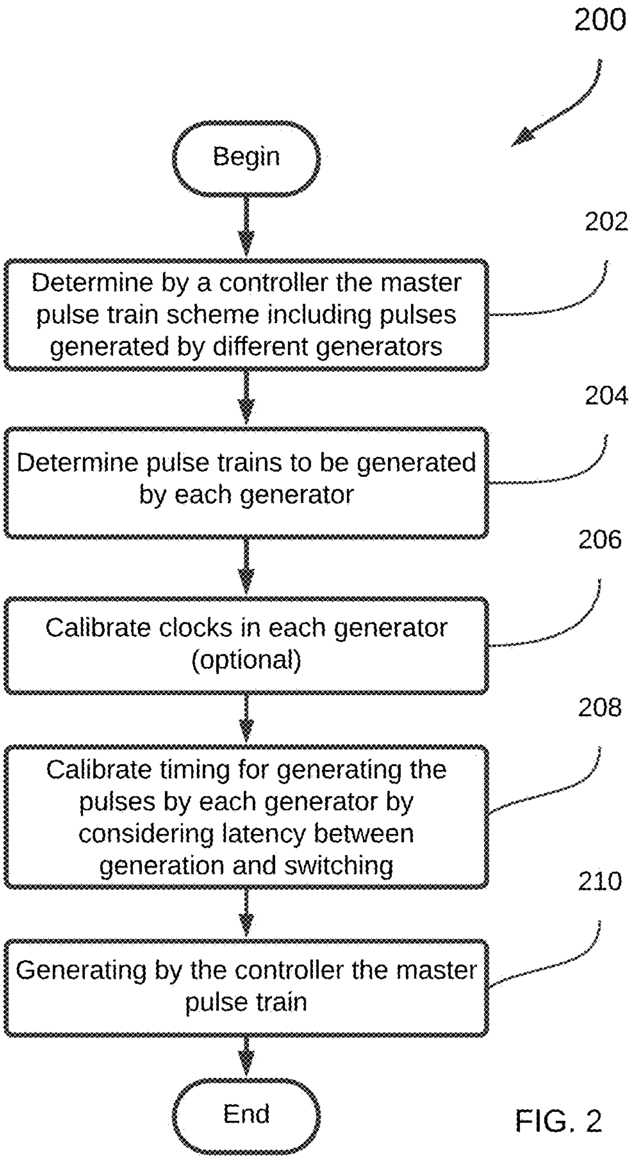
FIG. 2: Illustrates a flowchart of the exemplary RF system's operation.

FIG. 2 presents a flowchart depicting a method for delivering RF power in accordance with the first and second embodiments.

Process 200 begins with step 202, where the controller 124 determines the master pulse train scheme required to meet output specifications after processing the substrate. The scheme defines the timing, frequency, and power levels of the pulses constituting the master pulse train 122.

In step 204, the controller 124 assigns subsets of pulses within the master pulse train 122 to each RF generator (102, 104, 106). The time control module 126, common clock 128, and latency module 130 ensure precise pulse generation timing by compensating for latencies among the generators.

In step 206, optional synchronization of the generators may be performed. In one implementation, the clocks of the generators (102, 104, 106), controller 124, and MPST switch 110 are calibrated. Alternatively, a common clock may be shared among these components. In some configurations, the match 134 may also participate in clock calibration or share the common clock.

In step 208, the controller 124 determines the timing for generating each subset of pulses by considering the latency between pulse generation and switching, which is specific to each generator. These latencies may be modeled through simulations or determined via measurement procedures executed by the controller 124.

Finally, in step 210, each of the pulses is subsequently generated by a generator at a time. The MPST switch 110 then combines these pulses into the master pulse train 122 before delivering it to the load 108. This process ensures precise alignment of RF power delivery with the requirements of plasma-based processing, enhancing process efficiency and consistency.

The invention claimed is:

1. An RF system for a semiconductor manufacturing process system, comprising:

a plurality of generators, each configured to generate RF power or tailored waveform bias voltage in the form of pulse trains;

a load configured to receive the RF power or the tailored waveform bias voltage in the form of a master pulse train;

an MPST switch configured to connect one of the plurality of generators to the load while disconnecting the others at a time; and a controller configured to coordinate the operations of the generators and the MPST switch to place each pulse from the pulse trains into the master pulse train according to predetermined timing.

2. The system of claim 1, further comprising a time control module configured to manage the timing for generating each pulse by the generators and switching operations by the MPST switch.

3. The system of claim 2, wherein the time control module includes a latency module configured to compensate for latency differences between pulse generation and switching for different generators.

4. The system of claim 3, further comprising delay elements associated with each generator to compensate for the latency differences.

5. The system of claim 4, wherein the delay elements are programmable for different delay times.

6. The system of claim 3, wherein the latency module determines latency using a simulation or through measurement procedures executed by the controller.

7. The system of claim 2, wherein the time control module includes a common clock to synchronize the generators, the MPST switch, and the controller.

8. The system of claim 2, wherein the time control module calibrates respective independent clocks within the generators, the controller, and the MPST switch.

9. The system of claim 1, wherein the MPST switch comprises GaN high-electron-mobility transistors (GaN HEMTs) to enable high-speed and high-power switching.

10. The system of claim 1, wherein the master pulse train comprises pulses with distinct RF frequencies, power levels, and durations to optimize the load's performance.

11. The system of claim 1, wherein the load is an electrostatic chuck (ESC) configured to receive the RF power or the tailored waveform bias voltage to control plasma characteristics in a plasma chamber.

12. The system of claim 11, wherein the master pulse train is used to control plasma density, ion directionality, and ion energy distribution in the plasma chamber.

13. A method for delivering RF power, comprising:

providing an RF system comprising a plurality of RF power generators or tailored waveform generators, a load, an MPST switch, and a controller;

determining, by the controller, a master pulse train scheme based on a substrate's output specifications after processing, the scheme defining at least the timing, RF frequency, and RF power levels for each pulse;

assigning subsets of pulses within the master pulse train to each generator;

generating the assigned subsets of pulses by the generators and combining them into the master pulse train using the MPST switch; and delivering the master pulse train to the load.

14. The method of claim 13, further comprising managing the timing for generating each pulse.

15. The method of claim 13, further comprising compensating for latency differences among the generators using delay elements.

16. The method of claim 15, further comprising determining latency through simulations.

17. The method of claim 15, further comprising determining latency through measurement procedures executed by the controller.

18. The method of claim 13, further comprising optionally synchronizing the generators, MPST switch, and controller by calibrating respective independent clocks or sharing a common clock.

19. The method of claim 13, wherein the master pulse train comprises pulses with distinct RF frequencies, power levels, or durations designed to enhance the performance of the load.

20. The method of claim 13, wherein the load is an electrostatic chuck (ESC), wherein the master pulse train is used to optimize plasma parameters.

* * * * *